United States Patent [19]

Stevens

[11] Patent Number: 4,984,047

[45] Date of Patent: Jan. 8, 1991

[54] SOLID-STATE IMAGE SENSOR

[75] Inventor: Eric G. Stevens, Rochester, N.Y.

[73] Assignee: Eastman Kodak Company, Rochester, N.Y.

[21] Appl. No.: 171,042

[22] Filed: Mar. 21, 1988

[51] Int. Cl.⁵ .............................................. H01L 27/14
[52] U.S. Cl. .......................................... 357/30; 357/24
[58] Field of Search ............................. 357/24 LR, 30

[56] References Cited

U.S. PATENT DOCUMENTS

| 4,373,167 | 2/1983 | Yamada | 357/30 |
| 4,460,912 | 7/1984 | Takeshita et al. | 357/24 |
| 4,611,223 | 9/1986 | Hine et al. | 357/30 |
| 4,626,915 | 12/1986 | Takatsu | 357/24 |
| 4,688,098 | 8/1987 | Kon et al. | 357/30 |

Primary Examiner—Edward J. Wojciechowicz
Attorney, Agent, or Firm—Donald D. Schaper

[57] ABSTRACT

A solid-state image sensor is disclosed which comprises a pn photodiode formed in a P-type substrate. A charge-coupled device is disposed adjacent the photodiode for receiving signal carriers from the diode. A lateral-overflow drain is disposed adjacent the photodiode for receiving carriers from the photodiode. In order to provide a simplified image sensor, a virtual gate is formed between the photodiode and the drain to effect the flow of excess carriers from the photodiode.

6 Claims, 5 Drawing Sheets

PRIOR ART

4,984,047

SOLID-STATE IMAGE SENSOR

BACKGROUND OF THE INVENTION

1. Field of the Invention

The present invention relates to a solid-state image sensor and, more particularly, to a means for controlling blooming in an image-sensing element of such a sensor.

2. Description of the Prior Art

Solid-state image sensors are known in which signal carriers are generated in a photosensitive element in proportion to the luminous energy directed on the element. The signal carriers are read out by means of a charge-coupled device (CCD). When the quantity of light incident on the photosensitive element for a given period of time is relatively high, carriers are produced in the photosensitive element in excess of the storage capacity of the element; when this happens, the excess carriers flow into adjacent photosensitive elements. This results in a phenomenon known as blooming. In the reproduction of an image from signals generated by the sensors, the image quality is greatly degraded in areas where blooming occurred when the image was captured.

One known method of controlling blooming is through the use of vertical-overflow drains for removing excess carriers. In one such device, an N-type photosensitive element is separated from an N-type substrate by a P-type layer which is at a reference potential. When the substrate is biased above a predetermined potential, a punch through condition is obtained in which the P-type layer is in depletion condition. When this occurs, excess carriers from the photosensitive element can flow into the substrate which serves as the vertical overflow drain. A disadvantage of sensors which use vertical overflow drains is that the sensors exhibit a loss in responsivity in the green and red regions of the spectrum.

It is also known to use so-called lateral-overflow drains to control blooming in image sensors. In U.S. Pat. No. 4,460,912, there is disclosed a solid-state sensor of the interline transfer type in which photosensitive elements are arranged in vertical columns with a vertical transfer portion provided at one side of each of the photosensitive elements. On an opposite side of the photosensitive elements, a lateral-overflow drain is formed opposite each of the elements. An overflow gate control electrode is provided between each photosensitive element and its corresponding overflow drain, and a D.C. voltage is applied to the electrode to control the transfer of excess carriers to the overflow drain. A problem with this device is that there is a loss in the effective area of the sensor because of the additional control electrode for the overflow gate. Another problem is that it is difficult to manufacture the device with a pixel as small as desired because of the relatively large number of surface elements.

SUMMARY OF THE INVENTION

It is an object of the present invention to overcome the problems in the prior art described above, and to provide an improved solid-state device in which blooming is controlled.

In accordance with the present invention, there is provided a solid-state image sensor comprising: a semiconductor substrate of a first conductivity type; a photosensitive region of a second conductivity type formed in the substrate; a drain region in the photosensitive region, the drain region being of the second conductivity type and being of enhanced conductivity; a virtual-gate region formed in the photosensitive region adjacent the drain region, the virtual-gate region being of the first conductivity type and of enhanced conductivity; and means for reading out signal carriers generated in the photosensitive region.

In one embodiment of the present invention, a solid-state image sensor includes a pn photodiode formed in a P-type substrate. A charge-coupled device is formed adjacent the photodiode for receiving signal carriers from the photodiode. A lateral-overflow drain is formed in one area of the photodiode for receiving excess carriers from the photodiode. A virtual gate, which is in physical contact with a channel-stop region, is formed adjacent the drain. A voltage supplied to the drain effects the transfer of excess carriers from the photodiode to the drain.

One advantage of the present invention is that the need for an extra level of gate material and a contact for the gate are eliminated by the use of the virtual gate. A further advantage of the sensor is that the responsivity of the sensor is relatively high in all areas of the visible spectrum.

Other features and advantages will become apparent upon reference to the following description of the preferred embodiment when read in light of the attached drawings;

DESCRIPTION OF THE PREFERRED EMBODIMENT

The term "virtual gate," as used herein refers to structure in the disclosed image sensor element which performs the function performed by a gate and a gate control electrode in prior-art devices. The virtual gate in the present invention provides control of the electrostatic potential in a channel region directly under the virtual gate, thereby setting the "overflow point," that is, the level at which excess charge is drained from the photodiode.

Figure 1:
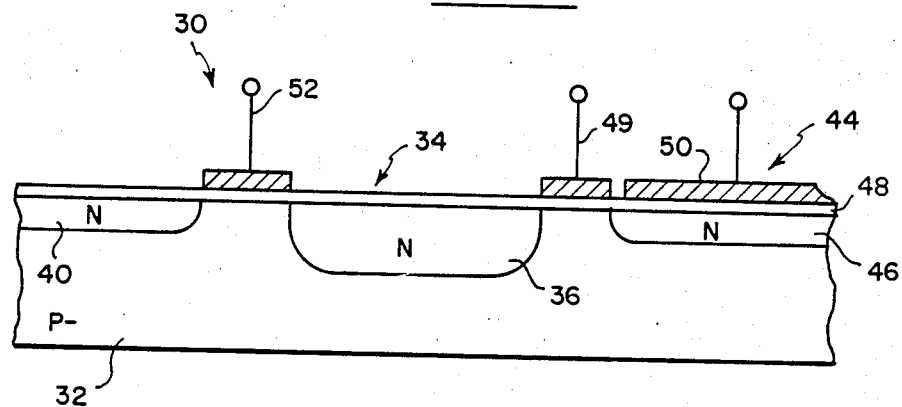
FIG. 1 is a sectional view of a prior-art solid-state image sensor of the interline transfer type.

With reference to FIG. 1, there is shown a prior-art solid state sensor 30. Sensor 30 comprises a P-type substrate 32. A photodiode 34 in substrate 32 includes an N-type region 36. At one side of photodiode 34, a lateral-overflow drain (LOD) 40 is formed by an N-type region. At the opposite side of photodiode 34, a charge-coupled device (CCD) 44 is formed by an N-type region 46. An insulating layer 48 is formed on the sensor 30, as shown in FIG. 1. A transfer gate electrode 49 is adapted to control the flow of carriers from photodiode 34 to device 44 and a vertical transfer electrode 50 is adapted to control the flow of carriers to a horizontal charge transfer portion (not shown). An LOD-gate-control electrode 52 is provided to control the flow of excess carriers to drain 40. As noted above, a disadvantage of prior-art sensors of the type shown in FIG. 1 is the necessity for a LOD-gate-control electrode such as the electrode 52 in sensor 30.

Figure 2:
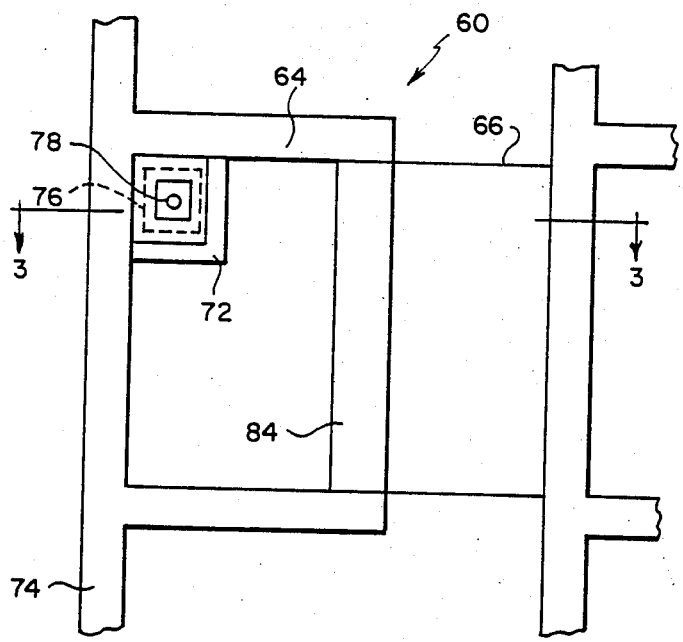
FIG. 2 is a plan view of an image sensor element of the present invention.
Figure 3:
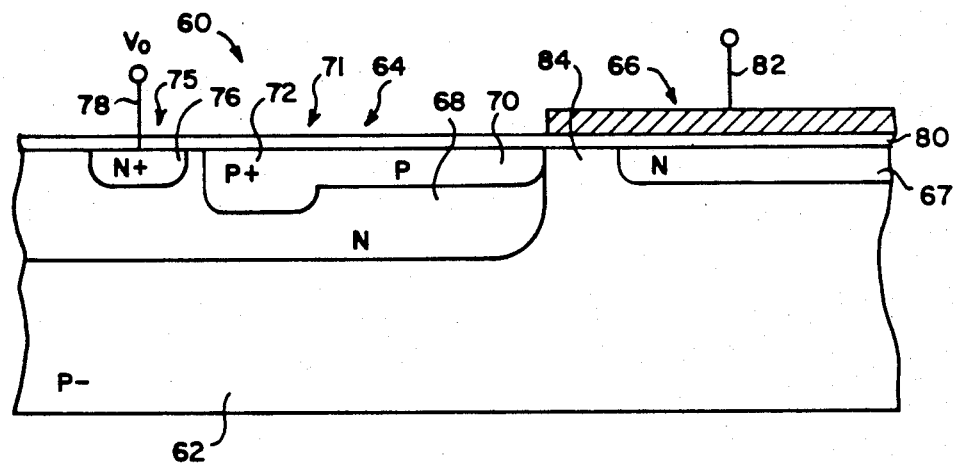
FIG. 3 is a sectional view, taken along the line 3—3 in FIG. 2.

An image sensor element 60 constructed in accordance with the present invention is shown in FIGS. 2 and 3. As shown in FIG. 3, element 60 comprises a P-type substrate 62, a pinned photodiode 64 and a buried channel charge-coupled device (CCD) 66. Device 66 includes an N-type region 67 in substrate 62. Photodiode 64 is formed in substrate 62 by an N-type region 68 having a pinning layer 70 formed thereon. In communication with layer 70 is a virtual gate 71 formed by an ion implanted P+ region 72 which is in contact with a P+ channel-stop region 74, as shown in FIG. 1. Channel-stop region 74, which is biased to a reference potential via substrate 62, serves to isolate the elements 60 from each other. The function of virtual gate 71 will be discussed in more detail hereinafter. A lateral-overflow drain (LOD) 75 is formed by an N+ region 76 implanted adjacent region 72. A bias voltage $V_D$ is supplied to drain 75 through a terminal 78. An insulating layer 80 of, for example, silicon dioxide is formed in element 60, as shown in FIG. 3. A potential supplied through a CCD-clock electrode 82 is used to effect both the transfer of carriers from photodiode 64 to device 66 through a transfer gate 84 and the transfer of carriers to a horizontial-charge-transfer portion 18 of an image sensor 10. (See FIG. 4.)

Figure 4:
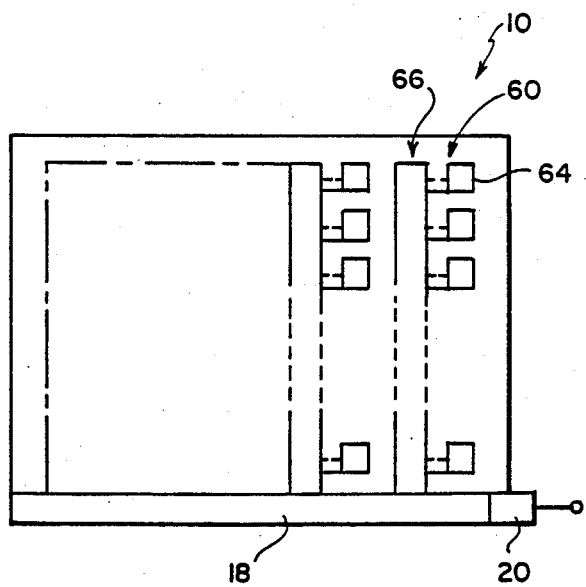
FIG. 4 is a plan view of an image sensor of the interline transfer type.

Image sensor elements 60 can be arranged in an image sensor as shown in image sensor 10 in FIG. 4. Image sensor 10 is of the interline transfer type. Image sensor elements 60 can also be employed in a linear image sensor (not shown). Image sensor 10 comprises a plurality of image sensor elements 60 which are arranged in horizontal rows and vertical columns as shown diagrammatically in FIG. 4. In the operation of image sensor 10, charge carriers are formed in photodiodes 64 in proportion to the luminous energy incident thereon; the charge carriers are transferred to the CCD's 66 where they are moved vertically (as viewed in FIG. 4) to a horizontial charge transfer portion 18 and then to an output portion 20.

Figure 5A:
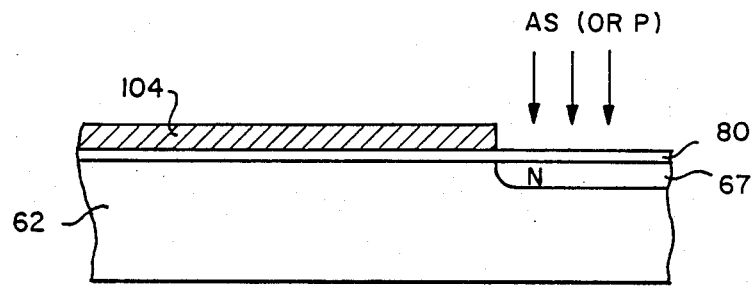
FIGS. 5A–5E show the steps performed in making the image sensor element of the present invention.
Figure 5B:
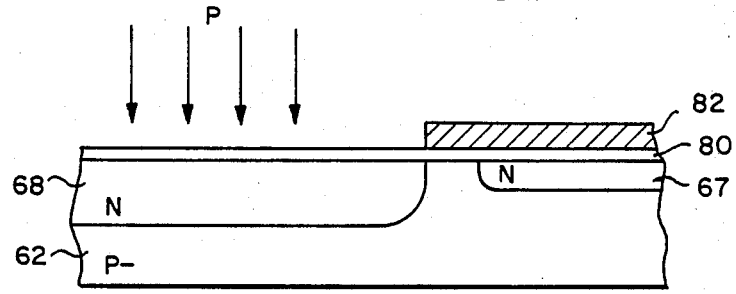
Figure 5C:
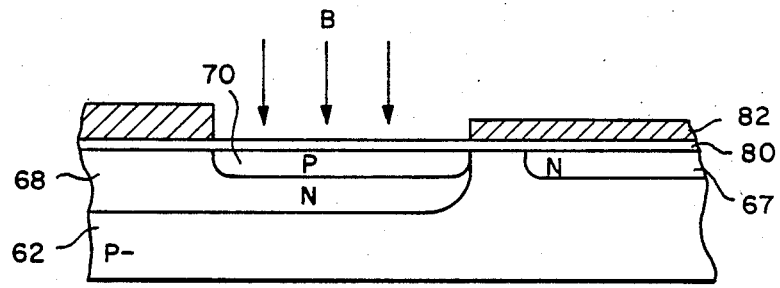
Figure 5D:
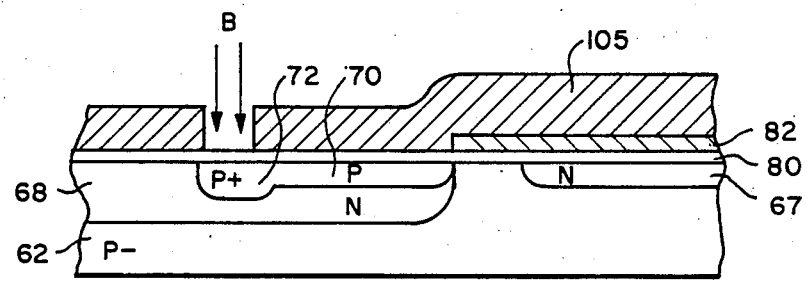
Figure 5E:
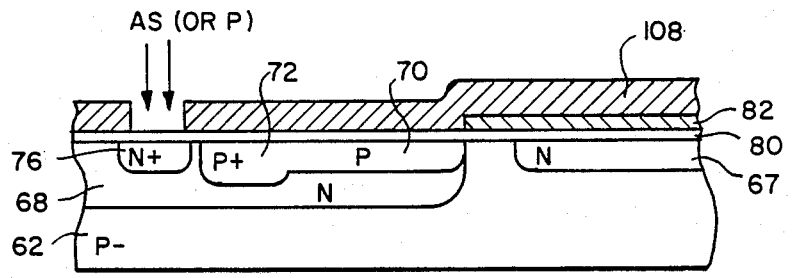

A manufacturing process for producing sensor 60 is shown in FIGS. 5A-5E. As shown in FIG. 5A, the process is started with the P-type substrate 62 having the insulating layer 80 formed thereon. A masking layer 104 is provided on the layer 80. In a first step, shown in FIG. 5A, ions of phosphorus or arsenic are implanted in substrate 62 to form the N-type region 67 of the buried channel CCD 66. In the next step, phosphorus ions are implanted to form the N-type region 68 of photodiode 64, as shown in FIG. 5B. Boron ions are implanted in region 68 at a given ion dose and ion energy to form the pinning layer 70 (FIG. 5C) and at a greater ion dose in one area, defined by masking layer 105, to form the P+ region 72 of virtual gate 71 (FIG. 5D). In the final implant step, shown in FIG. 5E, arsenic or phosphorus ions are implanted through an opening in a masking layer 108 to form the N+ region 76 of drain 75. After the steps shown in FIG. 5A-5E have been completed, a metalization step (not shown) is performed to make the electrodes and the necessary connections between devices.

Figure 7:
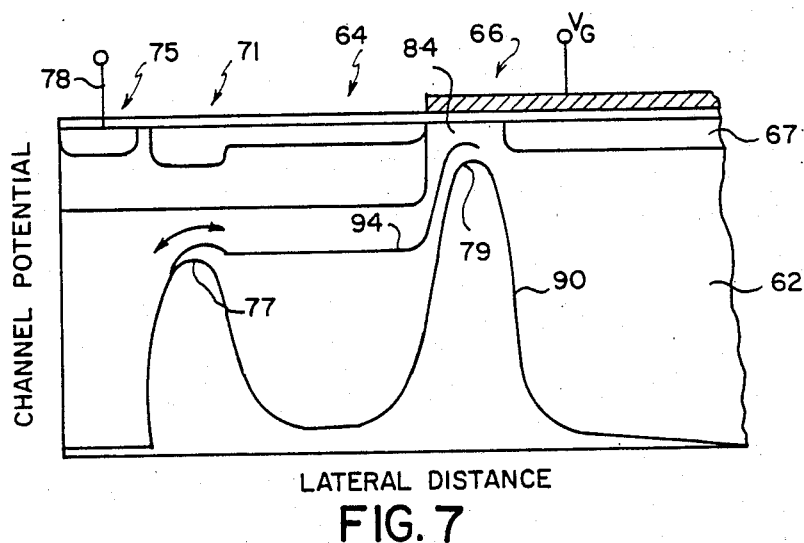
FIG. 7 is a sectional view of the image sensor element of the present invention, generally similar to the sectional view in FIG. 3, in which the electrostatic potential in the sensor has been indicated at various locations thereof.

The operation of the present invention can best be understood by reference to FIG. 7. In FIG. 7, the elements of sensor 60 are shown in section. Also shown is a curve 90 which illustrates the electrostatic potential in sensor 60 along its cross section during the integration period. Curve 90 has been constructed using lateral distance along the cross section as the X-axis and channel potential as the Y-axis, with the potential increasing in the direction of the X-axis. It will be seen that as charge carriers build up in photodiode 64 as a result of light impinging thereon, they will eventually reach a level indicated by line 94 at which time the charge carriers will flow beneath virtual gate 71 and into drain 75. The potential on drain 75 is maintained at a higher value than the potential at point 77 by means of a voltage $V_D$ supplied through terminal 78. When it is desired to transfer charge carriers to device 66, a voltage $V_G$ of a first level is supplied to electrode 82 which raises the potential at point 79 in curve 90 and thereby effects a flow of charge carriers through a transfer gate 84. When a voltage $V_G$ of a second level is supplied to electrode 82, charge carriers are shifted from device 66 in a direction perpendicular to the surface of the drawing in FIG. 7.

Figure 8:
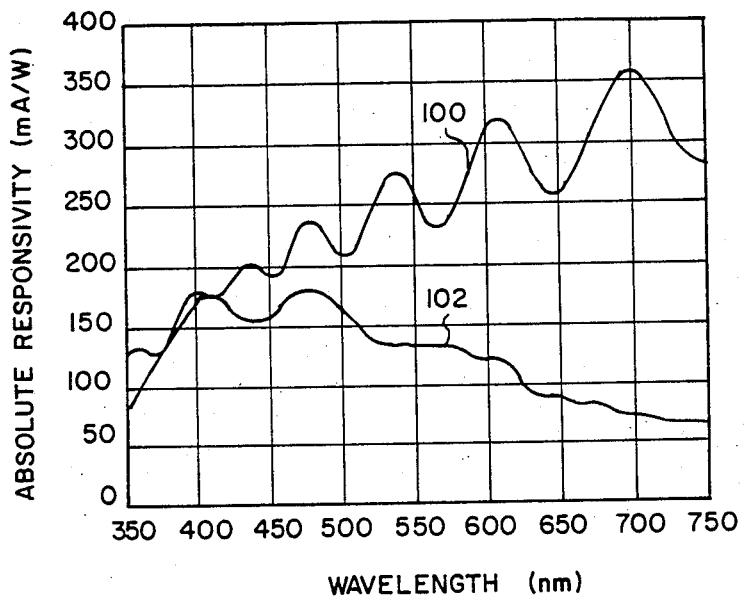
FIG. 8 is a graph showing a comparison of the responsivity of the image sensor element of the present invention with the responsivity of an image sensor element having a vertical-overflow drain.

As noted above, an advantage of the present invention is that there is no need for an electrode which controls the lateral-overflow drain. The present invention also provides an advantage over known sensors which utilize a vertical-overflow drain. This is illustrated in FIG. 8 in which curve 100 represents the responsivity of element 60 for wavelengths of 350 nm to 750 nm, and curve 102 represents the responsivity of a typical sensor (not shown) which has a vertical-overflow drain. It will be seen that, whereas element 60 actually increases in responsivity in the green and red regions (that is in wavelengths from approximately 550 nm to 650 nm), the sensor having a vertical-overflow drain steadily decreases in responsivity after a wavelength of about 500 nm. This phenomenon is well known in devices having vertical-overflow drains and is due to the fact that the majority of the longer-wavelength photons are absorbed beneath a relatively shallow overflow point located in the region between the photodiode and the substrate.

Figure 6:
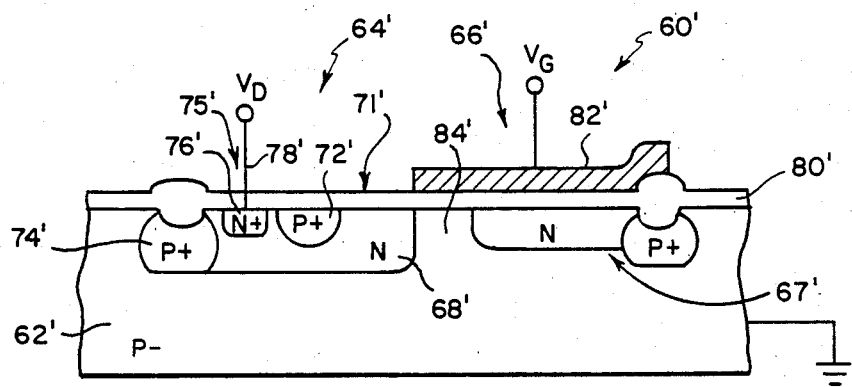
FIG. 6 shows a second embodiment of the present invention.

A second embodiment of the present invention is shown in FIG. 6 in which parts corresponding to parts in element 60 have been given the same reference numerals with a prime added. As shown in FIG. 6, an image sensor element 60' comprises a substrate 62', a photodiode 64', and a buried-channel charged-coupled device (CCD) 66' which includes an N-type region 67'. Photodiode 64' is formed in substrate 62' by an N-type region 68'. A virtual gate 71' is formed by an ion-implanted P+ region 72' which is in contact (in an area not shown) with a P+ channel-stop region 74'. An N+ region 76' adjacent region 72' forms a lateral-overflow drain 75'. A bias voltage $V_D$ is applied to drain 75' through a terminal 78'. An insulating layer 80' is formed in device 60'. A CCD-clock electrode 82' is provided to effect transfer of carriers from photodiode 64' to device 66' through a transfer gate 84'. The main difference between the element 60', shown in FIG. 6, and the element 60 described above is that device 60' does not have a layer corresponding to the pinning layer 70 in element 60. Element 60' functions in the same manner as element 60, except that the photodiode 64' is reset to a transfer-gate potential whereas photodiode 64 is reset to a pinned-diode potential.

The invention has been described in detail with particular reference to the preferred embodiments thereof, but it will be understood that variations and modifications can be effected within the spirit and scope of the invention.

I claim:

1. A solid-state image sensor comprising:
   a semiconductor substrate of a first conductivity type;
   a photosensitive region of a second conductivity type formed in said substrate;
   a drain region in said photosensitive region, said drain region being of said second conductivity type and being of enhanced conductivity;
   a virtual-gate region formed in said photosensitive region for controlling the flow of excess signal carriers from said photosensitive region into said drain region, said virtual-gate region extending along at least one side of said drain region and spaced therefrom, said virtual-gate region being of said first conductivity type and of enhanced conductivity; and
   means for reading out signal carriers generated in said photosensitive region.

2. A solid-state image sensor, as defined in claim 1, wherein a pinning layer is formed on said photosensitive region adjoining said gate region, and said pinning layer being of said first conductivity type and of a lower conductivity than said gate region.

3. A solid-state image sensor, as defined in claim 1, wherein said means for reading out signal carriers is a charge-coupled-device.

4. A solid-state image sensor, as defined in claim 3, wherein said charge-coupled device includes a buried channel in said substrate.

5. A solid-state image sensor, as defined in claim 4, wherein said charge coupled device includes a CCD-clock electrode.

6. A solid-state image sensor, as defined in claim 1, wherein the first and second conductivity types are P- and N-conductivity types respectively.

* * * * *